| United States Patent [19] | [11] Patent Number: 4,904,414 |
|---|---|
| Peltz et al. | [45] Date of Patent: Feb. 27, 1990 |

[54] ELECTRICALLY CONDUCTIVE ADHESIVE FOR A BROAD RANGE OF TEMPERATURES

[75] Inventors: Hanns-Heinz Peltz, Munich, Fed. Rep. of Germany; Dietrich Wolfer, Salzburg, Austria

[73] Assignees: Siemens Aktiengesellschaft, Berlin; Wacker-Chemie GmbH, Munich, both of Fed. Rep. of Germany

[21] Appl. No.: 98,184

[22] Filed: Sep. 18, 1987

[30] Foreign Application Priority Data

Sep. 25, 1986 [DE] Fed. Rep. of Germany ....... 3632628

[51] Int. Cl.$^4$ .............................................. H01B 1/06
[52] U.S. Cl. .................................... 252/514; 252/518; 524/439; 524/492
[58] Field of Search ...................... 252/514, 518, 511; 528/15; 156/329; 524/588, 439, 492

[56] References Cited

U.S. PATENT DOCUMENTS

| 4,051,454 | 9/1977 | Leiser et al. | 338/328 |
| 4,130,707 | 12/1978 | Leiser et al. | 252/514 |
| 4,250,075 | 2/1981 | Monroe et al. | 252/511 |

FOREIGN PATENT DOCUMENTS 2307776 1/1973 Fed. Rep. of Germany .

*Primary Examiner*—Josephine Barr
*Attorney, Agent, or Firm*—Hill, Van Santen, Steadman & Simpson

[57] ABSTRACT

An electrically conductive adhesive having elasticity over a wide temperature range of approximately −60° C. to about 180° C. for securing sensitive electronic components to a foundation is provided.

24 Claims, 1 Drawing Sheet

ELECTRICALLY CONDUCTIVE ADHESIVE FOR A BROAD RANGE OF TEMPERATURES

BACKGROUND OF THE INVENTION

The present invention is directed to electrically conductive adhesives for the planar joining of corresponding planar parts to one another.

Adhesives are used in the manufacture of electric surface wave filters, large-area IC semiconductor circuits, and corresponding electronic components in order to glue the components to a substrate. For example, if the substrate is to be a component part of the housing of the finished component, it is necessary to glue the substrate of, for example, the wave filter or, respectively, of the IC circuit or the like on, for example, a metallic substrate.

With respect to the substrates, it is known, for example, to utilize as a substrate for wave filters, laminae of single-crystal lithium niobate or tantalate having a length of up to several cm long and being about 0.5 mm thick. Substrate laminae of silicon or of other semiconductor material as well are used for IC circuits. These substrate materials share some similar properties that influence their use. Specifically, these materials are relatively sensitive to mechanical stresses and tend to break or rip when subjected to such mechanical stresses. Particularly in the case of surface wave filters, there is a further problem that the substrates are vulnerable to even mere mechanical deformations. A mere mechanical deformation, particularly bending, of the substrate leads to extremely great modifications in the electrical values of the component.

It is known to create a surface wave filter, or, respectively, an IC circuit on or, respectively, in a surface of the substrate. The substrate is connected to a foundation on an opposite surface thereof with an adhesive. The foundation is electrically grounded and forms an electrical shielding for the electronic structure of the filter or, respectively, of the IC circuit on the former surface. However, it is often important for such components that this shielding lying at ground, lie as close as possible to the zone of the electrical structure. When electrically conductive adhesive or glue having adequately high electrical conductivity for this purpose is utilized, then this shielding lies at that surface of the substrate lying opposite the electronic structure, i.e., considerably closer to the respective electronic structure.

It is preferable that the adhesive layer is sufficiently thick so that it absorbs all mechanical stresses to the greatest extent possible. Such mechanical stresses are due to, on the one hand, the different temperature coefficients of expansion of the material of the substrate and, on the other hand, on the material of the foundation. The adhesive layer absorbs these mechanical stresses because of the elasticity of, or, respectively, the viscosity of, the adhesive.

It is known in the art to use epoxy silver glue as an adhesive for these components. Epoxy silver glue provides satisfactory results as an adhesive for such components in temperature ranges between approximately 0° C. to about 125° C. However, there are numerous applications for these components in which a considerably broader range of temperatures of electrical operation or at least of storing the components must be taken into consideration. A temperature range that is typically required extends from approximately −40° C. to about 180° C.

In this broader temperature range, difficulties are encountered using typical adhesives. This is particularly true at lower temperatures at which an epoxy adhesive is so hard that it does not exhibit the required elasticity necessary to compensate for the stresses occurring within the adhesive. Because epoxy adhesives do not have the required elasticity at these lower temperatures, if epoxy adhesives are utilized, at these lower temperatures the substrate cracks and the component becomes unusable. The disadvantages of these known typical adhesives become especially acute in electronic applications, wherein even thermally induced bending of the substrate is not acceptable.

Accordingly, there is a need for an electrically conductive adhesive that is useable over a broader temperature range.

SUMMARY OF THE INVENTION

The present invention provides an electrically conductive adhesive for the planar joining of correspondingly planar parts to one another. These planar parts have mutually different temperature coefficients of expansion of their material. The adhesive of the present invention is useable over a broad temperature range that includes the typical temperatures the components will encounter. The product manufactured in accordance with the method of the present invention may be used as an electrically conductive adhesive through a broad temperature range of approximately −60° C. to about 180° C.

To create the electrically conductive adhesive of the present invention, particle-shaped silver is stirred into a composition that is cross-linkable with an organo polysiloxane with silicon-bonded hydrogen (e) to form an elastomer. A sufficient amount of silver is added to the composition so that the resultant adhesive has the required electrical conductivity. The composition comprises: (a) a di-organo polysiloxane with vinyl dimethyl siloxane units as end-position units, wherein the two Si-C-bonded organic radicals in the di-organo siloxane units are hydrocarbon radicals which are free from aliphatic multiple bonds, (b) an inorganic oxide, employable as filler, having a BET surface of at least $50m^2/g$, (c) an organic solvent, and (d) a catalyst that promotes the agglomeration of Si-bonded hydrogen to vinyl groups. After the particle-shaped silver is stirred into the composition, the mixture is thickened until a pasty working consistency has been achieved. The resultant mixture is then mixed with organo polysiloxane (e) before use as an adhesive.

Preferably, the organo polysiloxane (e) has the formula:

wherein: R is hydrogen or the methyl, ethyl and/or phenyl radical, however, only one hydrogen atom is bonded to a respective silicon atom, at least 0.2 Si-bonded hydrogen atoms are present on the average per silicon atom and at least three Si-bonded hydrogen atoms are present per molecule; and p is a whole number having a value so that the viscosity of these organo polysiloxanes (e) is approximately 4 to about 150mPa.s at 25° C.

DETAILED DESCRIPTION OF THE PRESENTLY PREFERRED EMBODIMENTS

Figure 1:
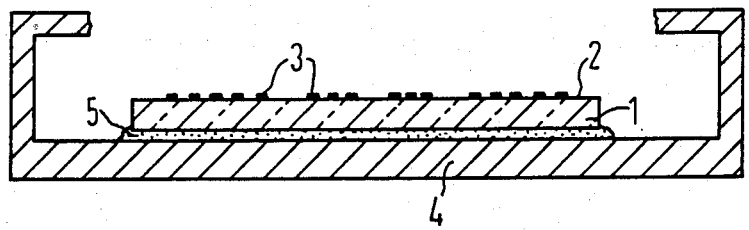
FIG. 1 illustrates a cross-sectional perspective view of a surface wave filter secured to a substrate by the adhesive of the present invention.

The present invention provides an electrically conductive adhesive. Although silicone adhesives are known, numerous attempts to employ these adhesives as electrically conductive adhesives as for such applications as discussed above, have previously led to the conclusion that silicone adhesives cannot be so used. In particular, heretofore, these adhesives have failed to provide the necessary high electrical conductivity required for such applications.

Surprisingly, the inventors of the present invention have developed a workable adhesive proceeding from a compound which is typically used as a coating of glass fabric and insulation for hoses and the like but which has not heretofore been utilized as an adhesive. This compound is defined in greater detail below.

In developing an adhesive numerous considerations must be taken into account. When the adhesive is to be utilized for electronic components and specifically for surface wave filters, substances, particularly of the adhesive, having components which evaporate, even only after a long duration, cannot be utilized. If a substance has a component that evaporates it will leave deposits on the structures and thereby permanently modify the structure's properties.

The inventors of the present invention have developed a composition that meets the considerations set forth previously and, at the same time, functions as an adhesive. To this end, the inventors have invented a composition that utilizes commercially available particular-shaped silver that is stirred into the composition, described hereinafter, resulting in a compound that has a good final distribution of the silver and can be used as an electrically conductive adhesive. The silver is preferably stirred into the composition at room temperature. The inventors of the present invention have discovered that particleshaped silver that has been stirred into, for example, a 10% composition defined in detail below in a sufficient quantity and with a uniform distribution, provides adequate values of conductivity comparable to those of epoxy silver glue. Such a result, however, can only be achieved via further method steps of the invention set forth below.

The composition having constituents (a)-(d) is produced as a dispersion. The composition is useable to create the adhesive of the present invention and is cross-linkable with (e) an organo polysiloxane with silicon-bonded hydrogen to form an elastomer. The composition comprises:
(a) a di-organo polysiloxane with vinyl dimethyl siloxane units as end-position units, whereby the two Si-C-bonded organic radicals in the di-organo siloxane units are hydrocarbon radicals which are free from aliphatic multiple bonds;
(b) an inorganic oxide, employable as a filler, having a BET surface of at least 50m$^2$/g;
(c) an organic solvent; and
(d) a catalyst promoting the agglomeration of Si-bonded hydrogen to vinyl groups.

Preferably, the di-organo polysiloxanes (a) chosen are those which preferably contain approximately 200 to about 800 silicon atoms per molecule, whereby other hydrocarbon radicals than vinyl groups in these di-organo polysiloxanes are preferably methyl radicals. The di-organo polysiloxane (a) is preferably present in approximately 10 to about 30 weight percent of the composition comprising constituents (a), (b), (c), and (d).

Particle-shaped silver is then stirred into the composition. The composition is thickened and organo polysiloxanes (e) are added.

The organo polysiloxanes (e) are preferably those having the formula:

$$RSi(CH_3)_2O(SiR_2O)_pSi(CH_3)_2R$$

wherein: R is hydrogen or the methyl, ethyl and/or phenyl radical having only one hydrogen atom bonded to a silicon atom, an average of at least 0.2 Si-bonded hydrogen atoms are present per silicon atom and at least 3 Si-bonded hydrogen atoms are present per molecule; and p is a whole number having a sufficient value so that the viscosity of these organo polysiloxanes (e) is approximately 4 to about 150 mPa.s at 25° C.

The organo polysiloxane (e) preferably comprises approximately 1 to about 3 weight percent, of the resultant composition that comprises constituents (a), (b), (c), (d), (e) and the silver particles Preferably, the inorganic oxide (b) is pyrogenically produced silicon dioxide having a BET surface of approximately 100 to about 200m$^2$/g Preferably, the inorganic oxide (b) is used in quantities of from approximately 10 to about 40 weight percent relative to the weight of the di-organo polysiloxane (a).

Preferably, the solvent (c) is chosen from hydrocarbons such as, for example, toluol, xylol-isomer mixtures, gasoline, including n-pentane, which are liquids at room temperature and 1020hPa (abs.) and have a boiling point less than or equal to 200° C. at 1020hPa (abs.). In a preferred embodiment, n-pentane is utilized as the solvent (c).

Preferably, the catalyst (d) is chosen from the group consisting of platinum, a platinum compound, or a platinum complex. Preferably, a platinum-vinyl siloxane complex free of inorganically bonded halogen is utilized as the catalyst (d).

In addition to the components stated above, in a preferred embodiment, an agent for preventing the agglomeration of silicon-bonded hydrogen to vinyl groups at room temperature is utilized. An example of such an agent is a maleic acid monoethylester.

Preferably, lamina-shaped silver is used as the particle-shaped silver. An example of a lamina-shaped silver that has been found to function satisfactorily is F14 available from the Demetron Company. It may also be desirable to utilize spherical silver. Extremely good results were also achieved with dendritic silver such as is also used for photographic film emulsions.

After the particle-shaped silver has been stirred into the composition as described above, the dispersion is thickened preferably by heating the dispersion and, potentially, by applying under-pressure as well, i.e., by withdrawing the solvent contained in this compound. A special characteristic of the present invention is that practically all of the solvent content can be withdrawn or, respectively is withdrawn from the compound. The resultant product is a silicone having a high percentage of silver uniformly distributed therein. This product has a pasty viscosity that makes it useful as an adhesive.

As stated above, in accordance with the present invention, a sufficiently high percentage of silver is stirred into the compound so that the resultant pasty end product, i.e. the adhesive, has a sufficiently high electrical conductivity that is comparable to that of epoxy silver adhesives. It has been found that a volume resistance of less than $4 \cdot 10^{-3}$ ohms/cm can be achieved with a silver content of 75 weight percent.

Before the organo polysiloxane (e) is added to the dispersion, (a)–(d), but after the silver is added, the composition can be tested to see if there is adequate conductivity. After the organo polysiloxane (e) is added, crosslinking will take place making the addition of additional silver difficult. It should also be noted that organo polysiloxane (e) is added in small amounts so that it does not influence the conductivity of the composition that was achieved.

FIG. 1 illustrates a cross-sectional view of a surface wave filter known in the art. The wave filter includes a substrate 1 on whose surface 2 transducer and/or reflector structures 3 are arranged in accordance with the requirements for the surface wave filter. As further illustrated, the substrate 1 is secured to a foundation 4 that is part of the housing by an adhesive layer 5 composed of adhesive of the present invention.

The material properties of the adhesive of the present invention, used for the adhesive layer 5, guarantees that thermal expansion of the foundation 4 do not lead to stresses and/or bendings of the substrate 1 and, thus, of the entire surface wave filter. To this end, the adhesive has good elasticity properties particularly at temperatures down to almost −40° C. As a result of negligible evaporation of the adhesive used for the layers, the problems typically encountered with such evaporations are also eliminated in the present invention. To this end, it must be noted that the surface wave filter is hermetically sealed from the environment in the housing 4 and accordingly, exhalations necessarily remain within the housing.

Figure 2:
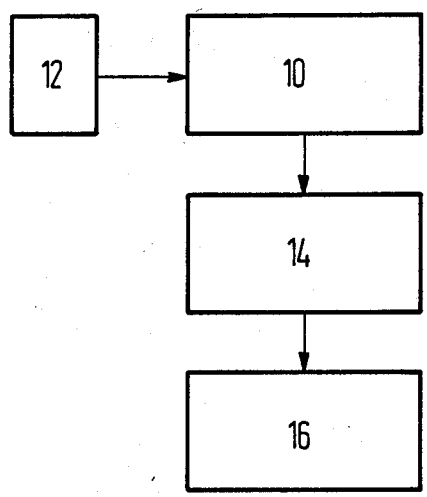
FIG. 2 illustrates a flow chart depicting the process steps of the method of making the adhesive of the present invention.

FIG. 2 illustrates a flow chart for the manufacture of the adhesive of the present invention. Particle-shaped silver 12 is added to a silicone dispersion at step 10. The particleshaped silver is added to the compound by being stirred therein. At step 14, the compound is thickened. The result is a pasty adhesive at 16.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An electrically conductive adhesive for the planar joining of correspondingly planar parts to one another, the planar parts having mutually different temperature coefficients of the expansion of their materials, the adhesive being useful through a temperature range of approximately −60° C. to about +180° C., the adhesive is manufactured by the following steps:

forming a composition that is cross-linkable to form an elastomer by the addition of organo polysiloxane with Si-bonded hydrogen (e), the composition comprising: (a) a di-organo polysiloxane with vinyl dimethyl siloxane units as end-position units, whereby the two Si-C-bonded organic radicals in the di-organo siloxane units are hydrocarbon radicals which are free from aliphatic multiple bonds; (b) silicon dioxide, employable as a filler, having a BET surface of approximately 100 to about 200 m²g; (c) an organic solvent; and (d) a catalyst for promoting the agglomeration of Si-bonded hydrogen to vinyl groups, the di-organo polysiloxane (a) comprising approximately 10 to about 30 weight percent of the total composition that comprises constituents (a), (b), (c), and (d), the inorganic oxide (b) being present in the composition in a quantity of approximately 10 to about 40 weight percent with respect to the weight of the di-organo polysiloxane (a);

stirring into the composition a sufficient amount of particle-shaped silver, chosen from the group consisting of dentritic silver, lamina-shaped silver, and spherical-shaped silver, so that the silver content is sufficiently great in the thickened condition of the resultant composition that the required electrical conductivity needed is present, the silver content, to afford the required electrical conductivity, comprises a minimum of 75% by weight of the resultant composition;

after the particle-shaped silver is stirred into the composition, the resultant mixture containing the particle-shaped silver is thickened until a pasty working consistency is achieved and the solvent is eliminated; and mixing the resultant mixture obtained with organo polysiloxane (e) to effect cross-linking by heating the mixture, the organo polysiloxane (e) comprising approximately 1 to about 3 weight percent of the overall weight of the constituents (a) through (e) and of the silver constituent.

2. The adhesive of claim 1 wherein the organic solvent of the composition is eliminated from the mixture during the thickening step.

3. The adhesive of claim 1 wherein the particle-shaped silver has a lamina shape.

4. The adhesive of claim 1 wherein the particle-shaped silver has a spherical shape.

5. The adhesive of claim 1 wherein the particle-shaped silver is dendritic silver.

6. The adhesive of claim 1 wherein the di-organo polysiloxane (a) includes approximately 200 to about 800 silicon atoms per molecule and the other hydrocarbon radicals than vinyl groups in these di-organo polysiloxanes are essentially methyl radicals.

7. The adhesive of claim 1 wherein the organo polysiloxane (e) has the formula:

$$RSi(CH_3)_2O(SiR_2O)_pSi(CH_3)_2R$$

wherein: R is hydrogen or the methyl, ethyl and/or phenyl radical, and only one hydrogen atom is bonded to a respective silicon atom, at least 0.2 Si-bonded hydrogen atoms are present on the average per silicon atom and at least three Si-bonded hydrogen atoms are present per molecule; and p is a whole number having a sufficient value that the viscosity of these organo polysiloxanes (e) is approximately 4 to about 150mPa.s at 25° C.

8. The adhesive of claim 1 wherein the inorganic oxide (b) is pyrogenically produced silicon dioxide having a BET surface of approximately 100 to about 200 m²/g.

9. The adhesive of claim 1 wherein the solvent (c) comprises hydrocarbons that are liquid at room temperature and 1020 hPa (abs.) and boil at or below 200° C. at 1020 hPa (abs.).

10. The adhesive of claim 9 wherein the solvent is n-pentane.

11. The adhesive of claim 1 wherein the catalyst is chosen from the group consisting of platinum, a platinum compound or a platinum complex.

12. The adhesive of claim 11, wherein the catalyst is a platinum vinyl siloxane complex free of inorganically bonded halogen.

13. The adhesive of claim 1 wherein the composition includes an agent for preventing the agglomeration of Si-bonded hydrogen to vinyl groups at room temperature.

14. The adhesive of claim 13 wherein the agent is a maleic acid monoethylester.

15. An electrically conductive adhesive for the planar joining of correspondingly planar parts to one another to create a component, the planar parts having mutually different temperature coefficients of the expansion of their materials, the adhesive being usable for components exposed to a temperature range of −60° C. to about +180° C., the adhesive being manufactured by:
providing a composition that is cross-linkable to form an elastomer by the addition of organo polysiloxane with Si-bonded hydrogen (e), the composition comprising: (a) a di-organo polysiloxane with vinyl dimethyl siloxane units as end-position units, whereby the two Si-C-bonded organic radicals in the di-organo siloxane units are hydrocarbon radicals which are free from aliphatic multiple bonds; (b) an inorganic oxide filler having a BET surface of approximately 100 to about 200 m²/g; (c) an organic solvent; and (d) a catalyst for promoting the agglomeration of Si-bonded hydrogen to vinyl groups, the di-organo polysiloxane (a) comprising approximately 10 to about 30 weight percent of the total composition that comprises constituents (a), (b), (c), and (d), the inorganic oxide (b) being present in the composition in a quantity of approximately 10 to about 40 weight percent with respect to the weight of the di-organo polysiloxane (a);
stirring particle-shaped silver having a dentritic shape, lamina shape, or spherical shape into a composition, the amount of silver stirred into the composition being sufficient so that the silver content of the resultant adhesive is sufficiently great so that the required electrical conductivity needed is present, the silver content, to afford the required electrical conductivity, comprises a minimum of 75% by weight of the resultant adhesive;
after the particle-shaped silver is added to the composition, the mixture is thickened until a pasty working consistency has been achieved; and
the resultant mixture obtained in then mixed with an organo polysiloxane (e) having the formula:

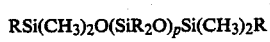

RSi(CH₃)₂O(SiR₂O)ₚSi(CH₃)₂R wherein: R is hydrogen or the methyl, ethyl and/or phenyl radical, and only one hydrogen atom is bonded to a respective silicon atom, at least 0.2 Si-bonded hydrogen atoms are present on the average per silicon atom and at least three Si-bonded hydrogen atoms are present per molecule; and p is a whole number having a sufficient value so that the viscosity of these organo polysiloxanes (e) is approximately 4 to about 150mPa.s at 25° C., the organo polysiloxane (e) comprising approximately 1 to about 3 weight percent of the overall weight of the constituents (a) through (e) and the silver constituent.

16. The adhesive of claim 15 wherein the inorganic oxide (b) is pyrogenically produced silicon dioxide having a BET surface of approximately 100 to about 200 m²/g.

17. The adhesive of claim 15 wherein the solvent (c) is chosen from the group of hydrocarbons that are liquid at room temperature and 1020 hPa (abs.) and boil at or below 200° C. at 1020 hPa (abs.).

18. The adhesive of claim 15 wherein the catalyst is chosen from the group consisting of platinum, a platinum compound or a platinum complex.

19. The adhesive of claim 15 wherein the composition includes an agent for preventing the agglomeration of Si-bonded hydrogen to vinyl groups at room temperature is added to the composition.

20. The adhesive of claim 15 wherein the organic solvent of the composition is eliminated from the adhesive during the thickening step.

21. The adhesive of claim 15 wherein the particle-shaped silver has a lamina shape.

22. The adhesive of claim 15 wherein the particle-shaped silver has a spherical shape.

23. The adhesive of claim 15 wherein the particle-shaped silver is dendritic silver.

24. The adhesive of claim 15 wherein the di-organo polysiloxane (a) includes approximately 200 to about 800 silicon atoms per molecule and the other hydrocarbon radicals than vinyl groups in these di-organo polysiloxanes are essentially methyl radicals.

* * * * *